(12) United States Patent
Miura

(10) Patent No.: US 10,291,443 B2
(45) Date of Patent: May 14, 2019

(54) SERIAL COMMUNICATIONS UNIT AND COMMUNICATION METHOD FOR SERIAL COMMUNICATIONS UNIT

(71) Applicant: FANUC CORPORATION, Yamanashi (JP)

(72) Inventor: Masahiro Miura, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/907,439

(22) Filed: Feb. 28, 2018

(65) Prior Publication Data

US 2018/0254932 A1 Sep. 6, 2018

(30) Foreign Application Priority Data

Mar. 1, 2017 (JP) ................................ 2017-037861

(51) Int. Cl.
*H04L 25/49* (2006.01)
*G05B 19/414* (2006.01)
*H04L 25/14* (2006.01)
*H03M 9/00* (2006.01)

(52) U.S. Cl.
CPC .......... *H04L 25/49* (2013.01); *G05B 19/4141* (2013.01); *H04L 25/14* (2013.01); *G05B 2219/41421* (2013.01); *H03M 9/00* (2013.01)

(58) Field of Classification Search
CPC ....... G06F 13/429; H04L 25/49; H04L 25/14; G05B 19/4141; H05B 2219/41421; H03M 9/00
See application file for complete search history.

(56) References Cited

U.S. PATENT DOCUMENTS

| 5,990,638 | A | 11/1999 | Aoyama et al. | |
|---|---|---|---|---|
| 2005/0063707 | A1* | 3/2005 | Imai | H04L 25/14 398/141 |
| 2008/0145065 | A1* | 6/2008 | Kawamura | H04J 3/073 398/182 |

FOREIGN PATENT DOCUMENTS

| JP | 63206031 A | 8/1988 |
|---|---|---|
| JP | 556025 A | 3/1993 |
| JP | 5300137 A | 11/1993 |

(Continued)

OTHER PUBLICATIONS

English Abstract and Machine Translation for Japanese Publication No. 2010-010854 A, published Jan. 14, 2010, 13 pgs.

(Continued)

*Primary Examiner* — Sung S Ahn
(74) *Attorney, Agent, or Firm* — Fredrikson & Byron, P.A.

(57) ABSTRACT

A communication method for a serial communications unit converts reception serial data into reception parallel data, stores the reception parallel data in a memory unit, and calculates a reception delay time of a reception start timing at which reception of packets is started. In addition, the reception parallel data which is stored in the memory unit is read out, and transmission parallel data, in which a transmission delay time of a transmission start timing at which transmission of packets is started is controlled so that a delay time from the reception start timing of packets and until transmission of packets is started is made constant, is output in synchronism with a transmission parallel clock pulse signal, and the output transmission parallel data is converted into transmission serial data and then is transmitted.

8 Claims, 7 Drawing Sheets

(56) References Cited

FOREIGN PATENT DOCUMENTS

| JP | 7303100 A | 11/1995 |
|---|---|---|
| JP | 1013394 A | 1/1998 |
| JP | 201010854 A | 1/2010 |
| JP | 201016545 A | 1/2010 |

OTHER PUBLICATIONS

English Abstract and Machine Translation for Japanese Publication No. 07-303100 A, published Nov. 14, 1995, 9 pgs.
Untranslated Decision to Grant a Patent mailed by Japan Patent Office (JPO) dated Sep. 11, 2018, for Application No. JP 2017-037861, 3 pgs.
English machine translation of Decision to Grant a Patent mailed by Japan Patent Office (JPO) dated Sep. 11, 2018 for Application No. JP 2017-037861, 3 pgs.
English Abstract and Machine Translation for Japanese Publication No. 2010-016545 A, published Jan. 21, 2010, 12 pgs.
English Abstract for Japanese Publication No. JPH1013394 A, published Jan. 16, 1998, 1 pg.
English Abstract and Machine Translation for Japanese Publication No. 05-300137 A, published Nov. 12, 1993, 6 pgs.
English Abstract and Machine Translation for Japanese Publication No. 05-056025 A, published Mar. 5, 1993, 9 pgs.
English Abstract and Machine Translation for Japanese Publication No. 63-206031 A, published Aug. 25, 1988, 6 pgs.

\* cited by examiner

SERIAL COMMUNICATIONS UNIT AND COMMUNICATION METHOD FOR SERIAL COMMUNICATIONS UNIT

CROSS-REFERENCE TO RELATED APPLICATION

This application is based upon and claims the benefit of priority from Japanese Patent Application No. 2017-037861 filed on Mar. 1, 2017, the contents of which are incorporated herein by reference.

BACKGROUND OF THE INVENTION

Field of the Invention

The present invention relates to a serial communications unit and a communication method for a serial communications unit, which is connected in a daisy chain fashion and carries out serial communications.

Description of the Related Art

In the case that a plurality of servo amplifiers (slaves) are connected to a CNC device (master) in a daisy chain fashion, in order to move each of respective axes that are controlled by respective servo amplifiers in synchronism with each other, it is essential for the CNC device and the respective servo amplifiers to be synchronized with each other. For this purpose, Japanese Laid-Open Patent Publication No. 10-013394 discloses a method of synchronizing communications in which the timings of a master device and slave devices are synchronized.

SUMMARY OF THE INVENTION

In serial communications which are performed in a daisy chain fashion, communications data transmitted from a master device passes through transmission lines connecting each of respective slave devices, and through a plurality of the slave devices, and arrives at a specified slave device. Therefore, the communications data arrives at the specified slave device while being delayed by a time obtained by summing the delay times of each of the transmission lines and each of the slave devices that exist between the master device and the specified slave device. Consequently, if the delay time of the communications data that arrives at the specified slave device is known, the timing thereof can be synchronized between the master device and the specified slave device.

The delay time of the transmission lines is uniquely determined by the distance, the material and the like of the transmission lines, however, a variation occurs in relation to the delay times in the slave devices. Due to such a variation, the synchronization precision of the timing between the master device and the specified slave device decreases. In general, the slave devices store serial data in memory units thereof, and read out and transmit the serial data that is stored in the memory units. Until it is received and stored in the memory unit, such serial data is synchronized with a reception serial clock pulse signal, and when it is read out from the memory unit and transmitted, the serial data is synchronized with a transmission serial clock pulse signal. The reception serial clock pulse signal and the transmission serial clock pulse signal exhibit the same communications frequency, but are out of phase with each other. The variation in the delay times in the slave devices occurs due to an influence when the serial data is switched (transferred) between asynchronous serial clock pulse signals (from a reception serial clock pulse signal to a transmission serial clock pulse signal that are mutually asynchronous).

As the communications frequency becomes high, although the variation in the delay times due to switching (transferring) decreases, handling of the serial data at such a high frequency becomes difficult due to the operation of the circuit. Thus, in general, it is common for the serial data to be temporarily converted into parallel data, and for the parallel data to be handled with a parallel clock pulse signal obtained by dividing the communications frequency. In this case, the received serial data is converted into parallel data which is synchronized with a reception parallel clock pulse signal, and the converted parallel data is stored in the memory unit. In addition, after the parallel data stored in the memory unit has been read out in synchronism with the transmission parallel clock pulse signal, the parallel data is converted into serial data in synchronism with the transmission serial clock pulse signal, and is transmitted. In this case, the variation in the delay times in the slave devices, which occurs due to asynchronous clock switching (transferring), depends on the frequency of the parallel clock pulse signal, and therefore, such a variation becomes greater in comparison with the case of being handled at the communications frequency.

Thus, an object of the present invention is to provide a serial communications unit as well as a communication method for a serial communications unit, in which a variation in the delay time when serial data is converted into parallel data can be suppressed.

A first aspect of the present invention is a serial communications unit connected in a daisy chain fashion, including a first conversion unit configured to convert reception serial data into reception parallel data which is synchronized with a reception parallel clock pulse signal, a memory unit configured to store the reception parallel data converted by the first conversion unit, a reception delay time calculating unit configured to calculate a reception delay time of a reception start timing at which reception of packets is started, on the basis of a reference parallel clock pulse signal having the same period as the reception parallel clock pulse signal, a timing control output unit configured to read out the reception parallel data stored in the memory unit in synchronism with a transmission parallel clock pulse signal having the same period as the reception parallel clock pulse signal, and to output transmission parallel data, in which a transmission delay time of a transmission start timing at which transmission of packets is started, on the basis of the reference parallel clock pulse signal, is controlled so that a delay time from the reception start timing and until transmission of packets is started is made constant, in synchronism with the transmission parallel clock pulse signal, and a second conversion unit configured to convert the transmission parallel data, which is output by controlling the transmission start timing, into transmission serial data.

A second aspect of the present invention is a serial communication method for a serial communications unit connected in a daisy chain fashion, including a first conversion step of converting reception serial data into reception parallel data which is synchronized with a reception parallel clock pulse signal, and storing the reception parallel data in a memory unit, a reception delay time calculating step of calculating a reception delay time of a reception start timing at which reception of packets is started, on the basis of a reference parallel clock pulse signal having the same period as the reception parallel clock pulse signal, a timing control output step of reading out the reception parallel data stored in the memory unit in synchronism with a transmission parallel clock pulse signal having the same period as the reception parallel clock pulse signal, and outputting transmission parallel data, in which a transmission delay time of a transmission start timing at which transmission of packets is started, on the basis of the reference parallel clock pulse signal, is controlled so that a delay time from the reception start timing and until transmission of packets is started is made constant, in synchronism with the transmission parallel clock pulse signal, and a second conversion step of converting the transmission parallel data, which is output by controlling the transmission start timing, into transmission serial data.

According to the present invention, even in the case that the serial data is converted into parallel data, with a simple circuit configuration, it is possible to suppress a variation in the delay time in the serial communications units.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

A preferred embodiment of a serial communications unit and a communication method for a serial communications unit according to the present invention will be presented and described in detail below with reference to the accompanying drawings.

Figure 1:
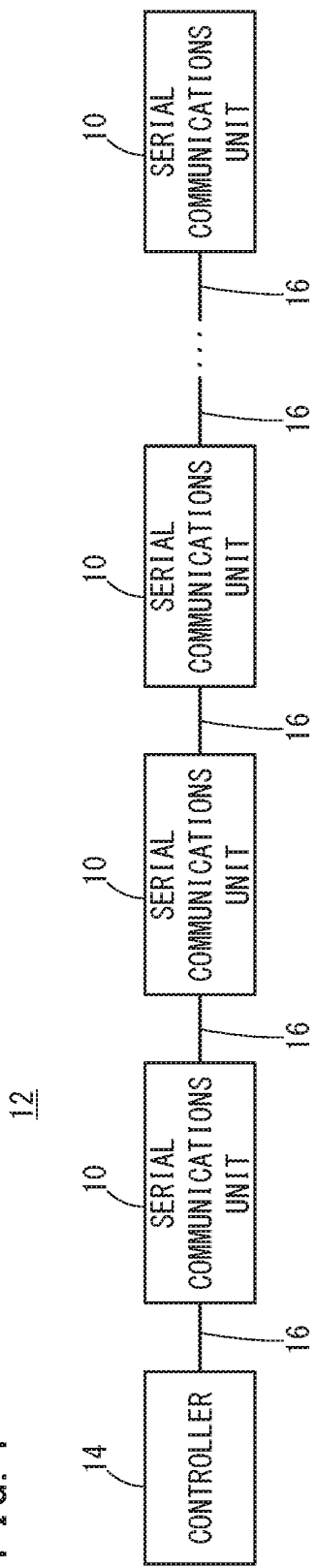
FIG. 1 is a diagram showing a communications system equipped with a plurality of serial communications units according to an embodiment of the present invention.

FIG. 1 is a diagram showing a communications system 12 equipped with a plurality of serial communications units 10. The plurality of serial communications units 10, which operate as slave devices, are connected in a daisy chain fashion to a controller (for example, a numerical controller) 14 which operates as a master device. The plurality of serial communications units 10 are connected with the controller 14 via transmission lines 16 in a daisy chain fashion.

Figure 2:
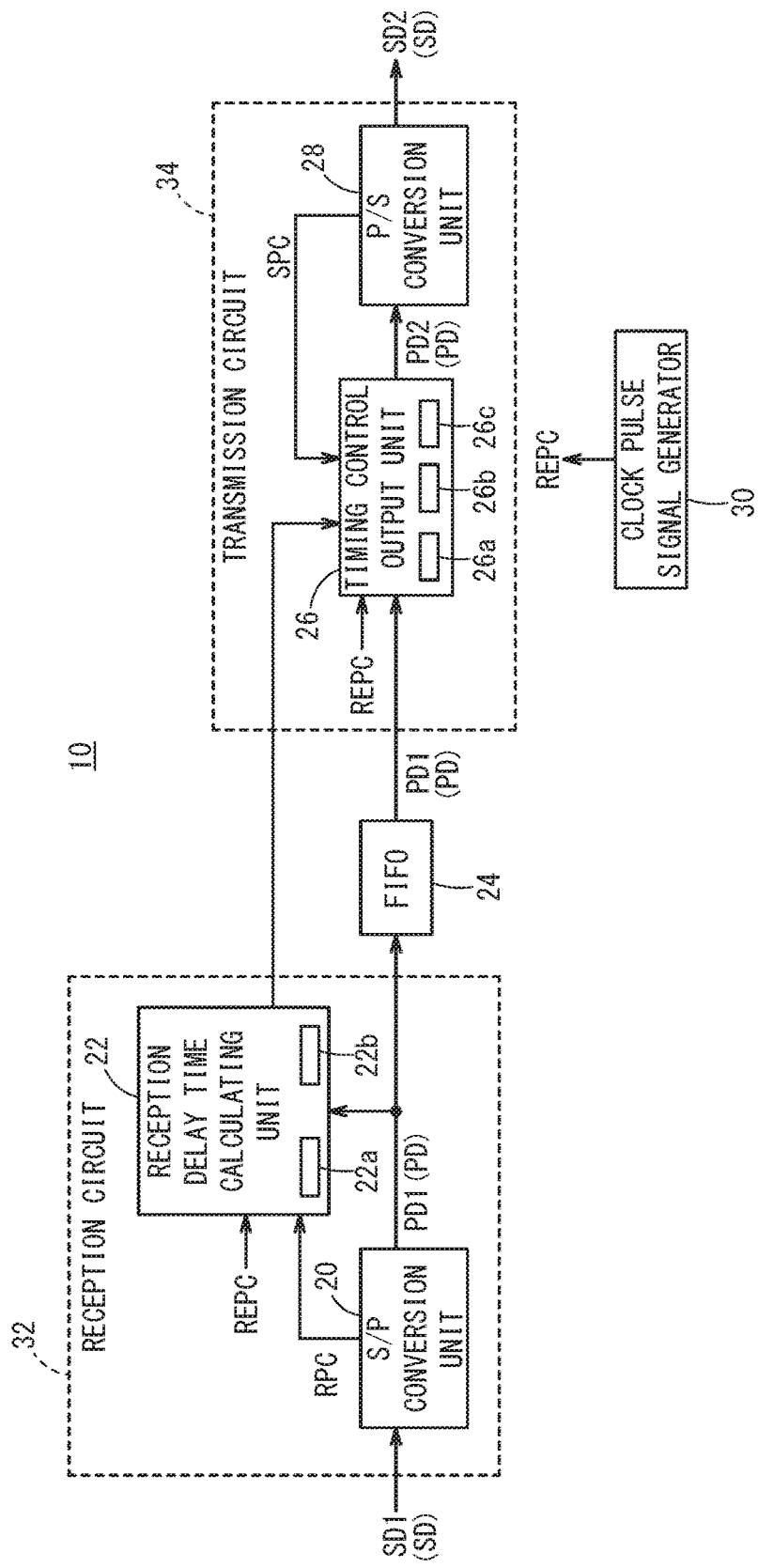
FIG. 2 is a diagram showing the configuration of one of the serial communications units shown in FIG. 1.
Figure 3:
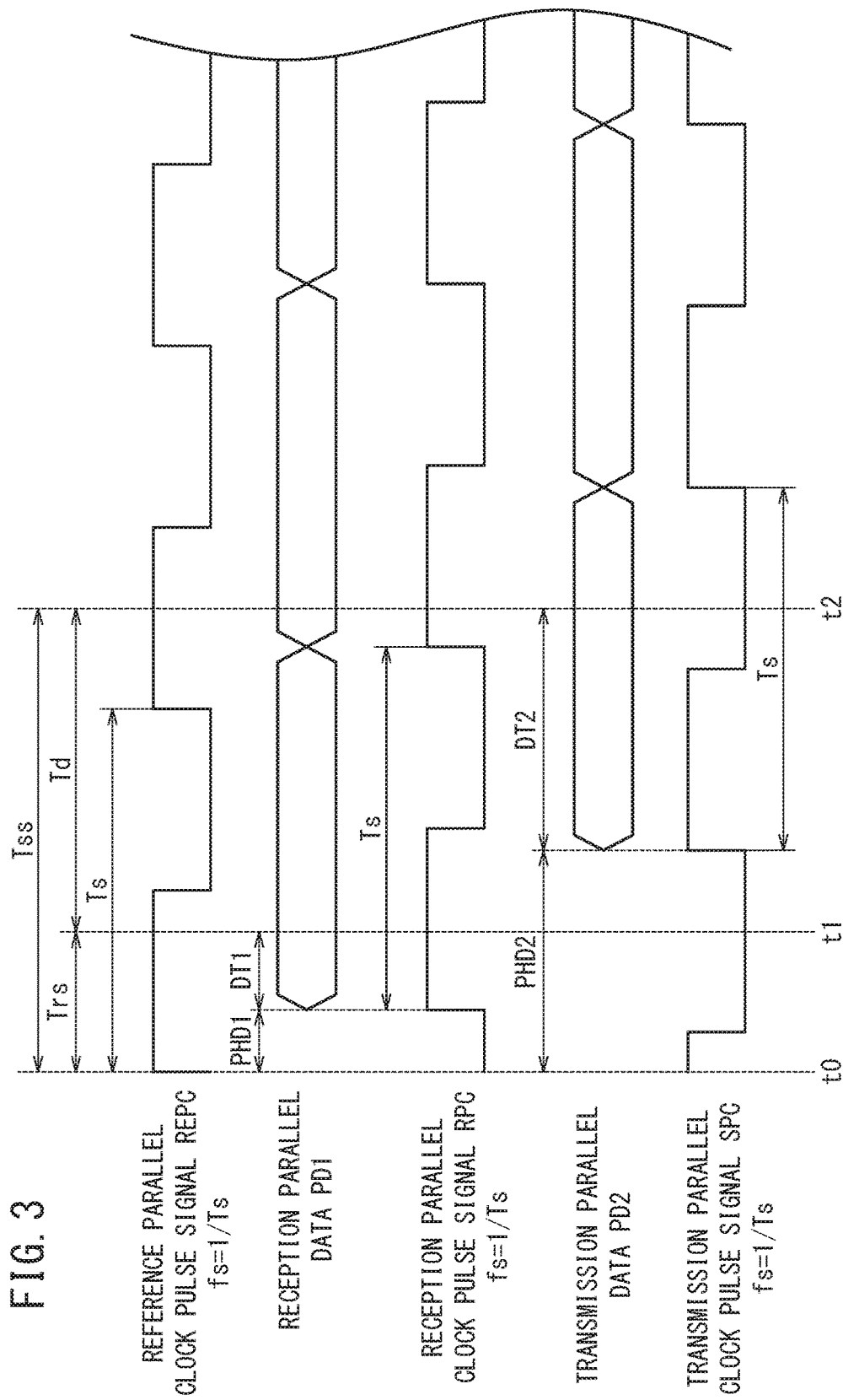
FIG. 3 is a time chart showing operations of the serial communications unit shown in FIG. 2.

FIG. 2 is a diagram showing the configuration of one of the serial communications units 10. As the need therefore arises, the configuration of the serial communications unit 10 will also be described with reference to FIG. 3. FIG. 3 is a time chart showing operations of the serial communications unit 10. The serial communications unit 10 comprises an S/P conversion unit 20, a reception delay time calculating unit 22, a FIFO buffer 24, a timing control output unit 26, a P/S conversion unit 28, and a clock pulse signal generator 30.

The clock pulse signal generator 30 generates a reference parallel clock pulse signal REPC. The reference parallel clock pulse signal REPC is a clock pulse signal having the same period and frequency as the period Ts and frequency fs of a reception parallel clock pulse signal RPC and a transmission parallel clock pulse signal SPC, to be described later. Further, the reference parallel clock pulse signal REPC is a clock pulse signal whose phase is out of phase with the reception parallel clock pulse signal RPC and the transmission parallel clock pulse signal SPC. The reference parallel clock pulse signal REPC which is generated by the clock pulse signal generator 30 is input to the reception delay time calculating unit 22 and the timing control output unit 26.

The S/P conversion unit 20 and the reception delay time calculating unit 22 constitute a reception circuit 32, and the timing control output unit 26 and the P/S conversion unit 28 constitute a transmission circuit 34. In principle, the reception circuit 32 operates with the reception parallel clock pulse signal RPC, and in principle, the transmission circuit 34 operates with the transmission parallel clock pulse signal SPC. However, a serial data processing unit (not shown) of the S/P conversion unit 20 operates with the reception serial clock pulse signal (frequency fc), which is synchronized with the received serial data SD, and a parallel data processing unit (not shown) of the S/P conversion unit 20 operates with the reception parallel clock pulse signal RPC. Similarly, a parallel data processing unit (not shown) of the P/S conversion unit 28 operates with the transmission parallel clock pulse signal SPC, and a serial data processing unit (not shown) of the P/S conversion unit 28 operates with the transmission serial clock pulse signal (frequency fc), which is synchronized with the transmitted serial data SD.

The S/P conversion unit (conversion unit, first conversion unit) 20 converts the received serial data SD (hereinafter referred to as reception serial data SD1) into parallel data PD. The reception serial data SD1 is serial data SD transmitted from the controller 14 or from another serial communications unit 10 connected to a preceding stage. The parallel data PD converted by the S/P conversion unit 20 will hereinafter be referred to as reception parallel data PD1.

The S/P conversion unit 20 includes a CDR (Clock Data Recovery) circuit, and from the reception serial data SD1, generates a reception parallel clock pulse signal RPC, which is required in order to convert the reception serial data SD1 into the reception parallel data PD1. The S/P conversion unit 20 converts the reception serial data SD1 into reception parallel data PD1 which is synchronized with the generated reception parallel clock pulse signal RPC.

The S/P conversion unit 20 outputs the converted (generated) reception parallel data PD1 to the reception delay time calculating unit 22 and the FIFO buffer (memory unit) 24. The FIFO buffer 24 stores the reception parallel data PD1 that was transmitted thereto.

According to the present embodiment, it is assumed that the S/P conversion unit 20 converts the reception serial data SD1 into the reception parallel data PD1 for each of respective 8-bit portions thereof. Accordingly, the frequency fs (fs=1/Ts) of the reception parallel clock pulse signal RPC is a frequency which is obtained by dividing the frequency fc of the reception serial clock pulse signal, which defines the communications rate of the reception serial data SD1, by 8. The period Tc of the reception serial clock pulse signal is expressed by Tc=1/fc. The relationship between the frequency fs and the frequency fc is indicated by fc=8×fs, and the relationship between the period Ts and the period Tc is indicated by Tc=Ts/8.

The reception delay time calculating unit 22 calculates a reception delay time Trs of a reception start timing t1 at which reception of packets included within the reception parallel data PD1 is started, on the basis of the reference parallel clock pulse signal REPC. For example, as shown in FIG. 3, a timing at which the reception delay time Trs has elapsed from a timing t0 of the rise of the reference parallel clock pulse signal REPC becomes the reception start timing t1.

More specifically, the reception delay time calculating unit 22 includes a phase difference detection unit 22*a* and a reception start delay amount detection unit 22*b*. The phase difference detection unit (first phase difference detection unit) 22*a* detects a phase difference (first phase difference) PHD1 between the reception parallel clock pulse signal RPC and the reference parallel clock pulse signal REPC (see FIG. 3).

The phase difference detection unit 22*a* is constituted by a PLL (Phase Locked Loop) or a DLL (Delay Locked Loop) or the like, and for example, generates a plurality of parallel clock pulse signals having phases that are shifted mutually from each other by a predetermined amount from the reference parallel clock pulse signal REPC. In addition, using the reference parallel clock pulse signal REPC and the plurality of generated parallel clock pulse signals, the phase difference PHD1 between the reception parallel clock pulse signal RPC and the reference parallel clock pulse signal REPC is detected. The method for detecting the phase difference is well known, as disclosed in Japanese Laid-Open Patent Publication No. 2010-016545. However, the method will be described briefly below.

Figure 4:
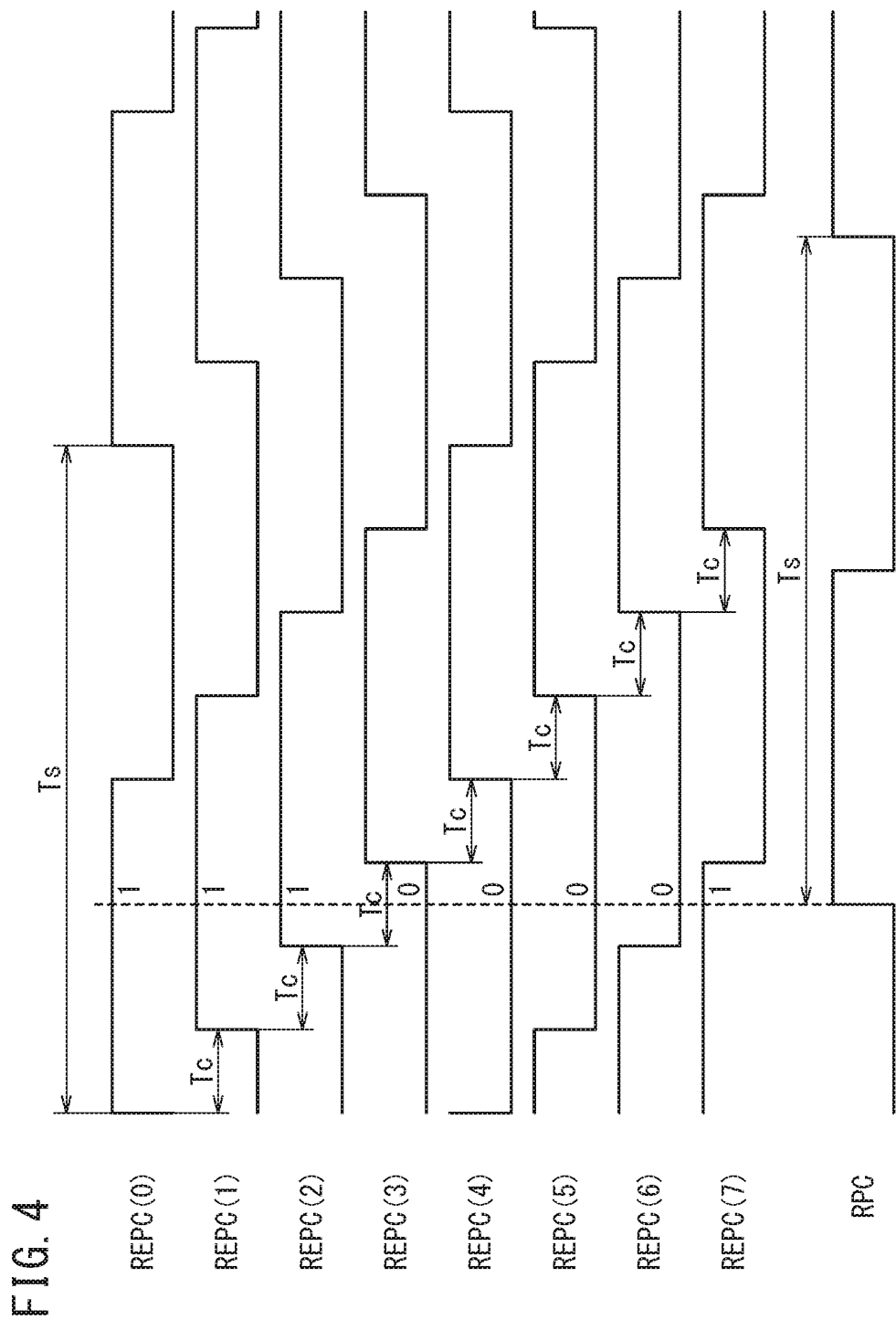
FIG. 4 is a time chart for explaining a phase difference detection method performed by a phase difference detection unit.

According to the present embodiment, the frequency fs of the reception parallel clock pulse signal RPC, the transmission parallel clock pulse signal SPC, and the reference parallel clock pulse signal REPC is set to ⅛ of the frequency fc of the communications rate of the reception serial data SD1. Therefore, the predetermined amount is set to ⅛ of the period Ts of the reference parallel clock pulse signal REPC, or in other words, is set to the period Tc, and as shown in FIG. 4, the phase difference detection unit 22*a* generates seven different parallel clock pulse signals the phases of which are shifted mutually by the period Tc from the reference parallel clock pulse signal REPC. The reason as to why the predetermined amount is set to the period Tc will briefly be described later.

In FIG. 4, the reference parallel clock pulse signal REPC is represented by the parallel clock pulse signal REPC(0). In addition, seven parallel clock pulse signals, in which the phases of each period Ts thereof are delayed from the parallel clock pulse signal REPC(0), are represented by REPC (1) to REPC(7). Accordingly, the parallel clock pulse signal REPC(1) becomes a parallel clock pulse signal which is delayed in phase by the period Tc from the parallel clock pulse signal REPC(0), and the parallel clock pulse signal REPC(2) becomes a parallel clock pulse signal which is delayed in phase by the period Tc from the parallel clock pulse signal REPC(1). In other words, the parallel clock pulse signals REPC(1) to REPC(7) are delayed in phase by the period Tc with respect to the preceding parallel clock pulse signals REPC(0) to REPC(6). Further, the parallel clock pulse signal REPC(7) is advanced in phase by the period Ts from the parallel clock pulse signal REPC(0).

Using the parallel clock pulse signal REPC(0) and the generated seven parallel clock pulse signals REPC(1) to REPC(7), the phase difference detection unit 22*a* detects the phase difference PHD1 between the reception parallel clock pulse signal RPC and the reference parallel clock pulse signal REPC. In greater detail, the phase difference detection unit 22*a* detects the phase difference PHD1 by observing values (an 8-bit string value) of the eight parallel clock pulse signals REPC(0) to REPC(7) at the timing of the rise of the reception parallel clock pulse signal RPC.

In the example shown in FIG. 4, at the timing of the rise of the reception parallel clock pulse signal RPC, an 8-bit string of 11100001 can be acquired. Moreover, the 8-bit string is a bit string in which the bit values thereof are arranged in the order of the parallel clock pulse signals REPC(0) to REPC(7). Within the 8-bit string, the position at which the bit values thereof change from "1" to "0" represents the phase difference PHD1 between the reception parallel clock pulse signal RPC and the reference parallel clock pulse signal REPC. Accordingly, the phase difference detection unit 22*a* detects the phase difference PHD1 by detecting the position where the bit values change from "1" to "0" within the acquired 8-bit string (11100001).

As shown in FIG. 4, the phase difference PHD1 between the reception parallel clock pulse signal RPC and the reference parallel clock pulse signal REPC is longer than the phase (2×Tc) of the parallel clock pulse signal REPC(2) with respect to the reference parallel clock pulse signal REPC, and is shorter than the phase (3×Tc) of the parallel clock pulse signal REPC(3) with respect to the reference parallel clock pulse signal REPC. In this manner, the phase difference detection unit 22*a* detects the phase difference PHD1.

Returning now to the description of FIG. 2, the reception start delay amount detection unit 22*b* analyzes the reception parallel data PD1, and detects a reception start delay amount DT1 of packets included within the reception parallel data PD1 (see FIG. 3). In greater detail, the reception start delay amount detection unit 22*b* analyzes the reception parallel data PD1, and detects the reception start delay amount DT1 by recognizing from which bit of the reception parallel data PD1 the packets start. For example, in the case that the packets start from the second bit of the reception parallel data PD1, the reception start delay amount DT1 becomes a delay amount corresponding to a total of two bits made up of the 0th bit and the 1st bit. The reception start delay amount DT1 is the reception start delay amount of packets taken with reference to (i.e., on the basis of) the reception parallel clock pulse signal RPC. Moreover, since a delay amount corresponding to 1 bit is defined by Tc, the delay amount corresponding to 2 bits is given by 2×Tc.

In an 8B10B code, which is commonly used in serial communications, K28.5 (indicated by "0011111010" or "1100000101" in the serial data) is used as a SYNC code indicative of the start of packets. Accordingly, the reception start delay amount detection unit 22*b* determines that the packets have started from a point in time when data that matches with the aforementioned bit string is found within the reception parallel data PD1. A unique SYNC code may also be used.

By adding the phase difference PHD1 and the reception start delay amount DT1, the reception delay time calculating unit 22 calculates the reception delay time Trs (Trs=PHD1+DT1) of the reception start timing t1 of packets included within the reception parallel data PD1, on the basis of the reference parallel clock pulse signal REPC (see FIG. 3). The reception delay time calculating unit 22 outputs the calculated reception delay time Trs to the timing control output unit 26.

The timing control output unit 26 reads out the reception parallel data PD1 that was stored in the FIFO buffer 24 in synchronism with the transmission parallel clock pulse signal SPC. In addition, the timing control output unit 26 outputs, in synchronism with the transmission parallel clock pulse signal SPC, parallel data PD (hereinafter, referred to as transmission parallel data PD2), in which a transmission start timing t2 at which transmission of packets is started is controlled, so that a delay time Td from the reception start timing t1 of packets and until transmission of packets is started is made constant. The timing control output unit 26 controls the transmission start timing t2 by controlling the packet transmission delay time Tss with reference to (i.e., on the basis of) the reference parallel clock pulse signal REPC. In other words, the timing control output unit 26 outputs, in synchronism with the transmission parallel clock pulse signal SPC, the transmission parallel data PD2 in which the transmission start timing t2 of packets included within the read-out reception parallel data PD1 is delayed by the predetermined delay time Td from the reception start timing t1 of packets.

The transmission delay time Tss is a time (Tss=Trs+Td) obtained by adding together the reception delay time Trs and the delay time Td. Accordingly, a timing at which the transmission delay time Tss has elapsed from the timing t0 of the rise of the reference parallel clock pulse signal REPC becomes the transmission start timing t2.

More specifically, the timing control output unit 26 includes a transmission delay time calculating unit 26a, a phase difference detection unit 26b, and a transmission start delay amount detection unit 26c. The transmission delay time calculating unit 26a adds the reception delay time Trs and the delay time Td, thereby calculating the transmission delay time Tss of the transmission start timing t2 of packets on the basis of the reference parallel clock pulse signal REPC.

The phase difference detection unit (second phase difference detection unit) 26b detects a phase difference (second phase difference) PHD2 between the transmission parallel clock pulse signal SPC and the reference parallel clock pulse signal REPC. The phase difference detection unit 26b is constituted by a PLL (Phase Locked Loop) or a DLL (Delay Locked Loop) or the like, and for example, generates a plurality of parallel clock pulse signals having phases that are shifted mutually from each other by a predetermined amount from the reference parallel clock pulse signal REPC. In addition, using the reference parallel clock pulse signal REPC and the plurality of generated parallel clock pulse signals, a phase difference PHD2 between the transmission parallel clock pulse signal SPC and the reference parallel clock pulse signal REPC is detected. Since the phase difference detection unit 26b has similar functions as the phase difference detection unit 22a, a description of the phase difference detection unit 26b will be omitted.

The transmission start delay amount detection unit 26c subtracts the phase difference PHD2 from the transmission delay time Tss of the transmission start timing t2 of packets on the basis of the reference parallel clock pulse signal REPC, thereby detecting, on the basis of the transmission parallel clock pulse signal SPC, a transmission start delay amount DT2 (DT2=Tss−PHD2) of packets. Since the timing control output unit 26 outputs the transmission parallel data PD2 in synchronism with the transmission parallel clock pulse signal SPC, the transmission start delay amount detection unit 26c converts the transmission delay time Tss of the transmission start timing t2 on the basis of the reference parallel clock pulse signal REPC into the transmission start delay amount DT2 of the transmission start timing t2 on the basis of the transmission parallel clock pulse signal SPC.

The timing control output unit 26 controls the transmission start timing t2 of packets based on the transmission start delay amount DT2. Consequently, the transmission delay time Tss of the transmission start timing t2 of packets is controlled on the basis of the reference parallel clock pulse signal REPC. The timing control output unit 26 outputs to the P/S conversion unit 28 in synchronism with the transmission parallel clock pulse signal SPC the transmission parallel data PD2, including the packets for which the transmission start timing t2 thereof is controlled. Accordingly, the SYNC code, which is indicative of starting of packets at the controlled transmission start timing t2, is output to the P/S conversion unit 28.

The P/S conversion unit (conversion unit, second conversion unit) 28 converts the transmission parallel data PD2, which was output by controlling the transmission start timing t2 of packets, into serial data SD. The serial data SD converted by the P/S conversion unit 28 will hereinafter be referred to as transmission serial data SD2.

The P/S conversion unit 28 generates the transmission parallel clock pulse signal SPC from an externally applied reference clock pulse signal. The P/S conversion unit 28 converts the transmission parallel data PD2 into the transmission serial data SD2 using the generated transmission parallel clock pulse signal SPC. The frequency of the transmission serial clock pulse signal, which is the communications rate of the transmission serial data SD2, is designated by fc, and the period thereof is designated by Tc.

The P/S conversion unit 28 transmits the converted transmission serial data SD2 to another serial communications unit 10 which is connected at a subsequent stage. The transmission serial data SD2 is treated as reception serial data SD1, as considered from the perspective of the other serial communications unit 10 which is connected at the subsequent stage.

Concerning this feature, Japanese Laid-Open Patent Publication No. 05-300137 discloses a technique in which reception serial data is converted into parallel data on the basis of a reception parallel clock pulse signal (first conversion timing signal), and the parallel data is converted into serial data on the basis of a transmission parallel clock pulse signal (second conversion timing signal). In addition, it is disclosed that the serial data is data in which tokens and frames are surrounded by delimiter codes, and a phase difference of the transmission parallel clock pulse signal with respect to the reception parallel clock pulse signal is initialized to δ every time that a delimiter code is input. By having such a configuration, the delay time of the transmission serial data with respect to the reception serial data can be made constant, however, since the phase of the transmission parallel clock pulse signal is moved suddenly at the time of initializing the phase difference, it becomes difficult to design the timing of the circuit that is operated with the transmission parallel clock pulse signal. Since the phase of the reception serial data undergoes a sudden change with respect to the unit that receives the transmission serial data at the end of the previous transmission path, there is a concern over malfunctioning of the CDR.

However, the serial communications unit 10 according to the present embodiment includes the above-described configuration, and therefore, in the serial communications unit 10, without causing any movement in the phase of the transmission parallel clock pulse signal SPC, the packets are transmitted after a constant delay time Td has elapsed from the reception start timing t1 of packets of the reception serial data SD1. Accordingly, with a simple configuration, it is possible to suppress a variation in the delay time in the serial communications units 10. Further, since the transmission start timing t2 of packets can be adjusted by the period Tc of the communications rate, any variation in the delay times in the serial communications units 10 due to asynchronous clock switching (transferring) depends on the frequency fc of the communications rate, and does not depend on the frequency fs of the reception parallel clock pulse signal RPC and the transmission parallel clock pulse signal SPC. Accordingly, it is possible to suppress a variation in the delay time in the serial communications units 10.

In this instance, although the phase difference detection unit 22a (26b) generates a plurality of parallel clock pulse signals the phases of which are shifted from the reference parallel clock pulse signal REPC by a predetermined amount (by the period Tc of the communications rate), by shortening the predetermined amount, the detection accuracy of the phase differences PHD1, PHD2 can be enhanced. However, since the transmission start timing t2 of packets is shifted in units of the period Tc, even if the predetermined amount is made shorter than the period Tc, the accuracy in controlling the positioning of the transmission start timing t2 of packets is not improved, and therefore, the predetermined amount is set to the period Tc.

Figure 5:
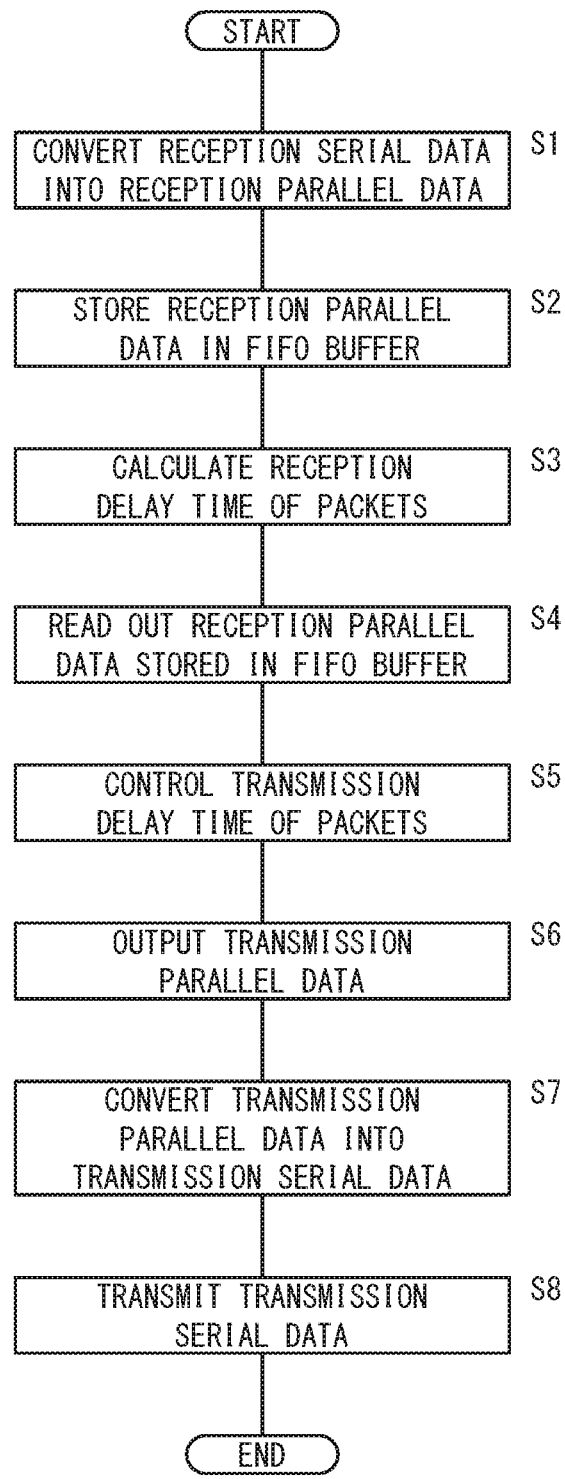
FIG. 5 is a flowchart showing operations of the serial communications unit shown in FIG. 2.

Next, operations of the serial communications unit 10 will be described with reference to FIG. 5. Upon receiving the reception serial data SD1, the S/P conversion unit 20 generates the reception parallel clock pulse signal RPC from the reception serial data SD1, and converts the reception serial data SD1 into reception parallel data PD1 which is synchronized with the reception parallel clock pulse signal RPC (step S1).

Then, the S/P conversion unit 20 stores the converted reception parallel data PD1 in the FIFO buffer 24 (step S2). The operation of step S2 may be performed after operation of the later-described step S3, or the operations of step S2 and step S3 may be performed in parallel.

Next, on the basis of the reference parallel clock pulse signal REPC, the reception delay time calculating unit 22 calculates the reception delay time Trs of the reception start timing t1 of packets (step S3). At this time, the phase difference detection unit 22a of the reception delay time calculating unit 22 detects the phase difference PHD1 between the reference parallel clock pulse signal REPC and the reception parallel clock pulse signal RPC, and the reception start delay amount detection unit 22b of the reception delay time calculating unit 22 analyzes the reception parallel data PD1, and detects the reception start delay amount DT1 of packets. Then, the reception delay time calculating unit 22 calculates as the reception delay time Trs a time obtained by adding the phase difference PHD1 and the reception start delay amount DT1.

Next, the timing control output unit 26 reads out the reception parallel data PD1 that was stored in the FIFO buffer 24 (step S4).

In addition, the timing control output unit 26 controls (adjusts) the transmission delay time Tss of the transmission start timing t2 of packets included within the reception parallel data PD1 on the basis of the reference parallel clock pulse signal REPC (step S5). The transmission delay time Tss is calculated by the transmission delay time calculating unit 26a. The transmission delay time Tss is a time obtained by adding the reception delay time Trs and the predetermined constant delay time Td.

In this instance, from the fact that the timing control output unit 26 outputs the transmission parallel data PD2 in synchronism with the transmission parallel clock pulse signal SPC, it is necessary to convert the transmission delay time Tss of the transmission start timing t2 on the basis of the reference parallel clock pulse signal REPC into the transmission start delay amount DT2 of the transmission start timing t2 on the basis of the transmission parallel clock pulse signal SPC. Thus, the phase difference detection unit 26b of the timing control output unit 26 detects the phase difference PHD2 between the reference parallel clock pulse signal REPC and the transmission parallel clock pulse signal SPC, and by subtracting the phase difference PHD2 from the transmission delay time Tss, the transmission start delay amount detection unit 26c of the timing control output unit 26 detects (calculates) the transmission start delay amount DT2 of the transmission start timing t2 of packets on the basis of the transmission parallel clock pulse signal SPC. In addition, the timing control output unit 26 controls (adjusts) the transmission start timing t2 of packets in accordance with the transmission start delay amount DT2.

Next, the timing control output unit 26 outputs the transmission parallel data PD2, in which the transmission start timing t2 of packets is controlled, to the P/S conversion unit 28 (step S6).

Next, the P/S conversion unit 28 generates the transmission parallel clock pulse signal SPC from the externally applied reference clock pulse signal, and using the generated transmission parallel clock pulse signal SPC, converts the transmission parallel data PD2 into the transmission serial data SD2 (step S7).

In addition, the P/S conversion unit 28 transmits the converted transmission serial data SD2 to another serial communications unit 10 which is connected at a subsequent stage (step S8).

In the case that there is data to be transmitted from itself (hereinafter, referred to as its own data or self data), the serial communications unit 10 outputs its own data to the timing control output unit 26 via a non-illustrated multiplexer disposed between the FIFO buffer 24 and the timing control output unit 26. The multiplexer selects one from among the reception parallel data PD1 and the self data that are stored in the FIFO buffer 24, and outputs the selected data to the timing control output unit 26.

MODIFICATIONS

The above-described embodiment may be modified in the following manner.

Modification 1

In the above-described embodiment, a clock pulse signal having the same period and being out of phase with the reception parallel clock pulse signal RPC and the transmission parallel clock pulse signal SPC was used as the reference parallel clock pulse signal REPC. However, according to Modification 1, the reception parallel clock pulse signal RPC is used as the reference parallel clock pulse signal REPC.

Since the serial communications unit 10 of Modification 1 has a configuration substantially the same as that shown in FIG. 2, only features thereof that differ from the aforementioned embodiment will be described. According to Modification 1, since the reception parallel clock pulse signal RPC itself serves as the reference parallel clock pulse signal REPC, the clock pulse signal generator 30 that generates the reference parallel clock pulse signal REPC is not required. Therefore, the phase difference detection unit 22a, which detects the phase difference PHD1 between the reference parallel clock pulse signal REPC and the reception parallel clock pulse signal RPC, also is rendered unnecessary. In addition, the reception parallel clock pulse signal RPC is input to the timing control output unit 26 as the reference parallel clock pulse signal REPC.

Figure 6:
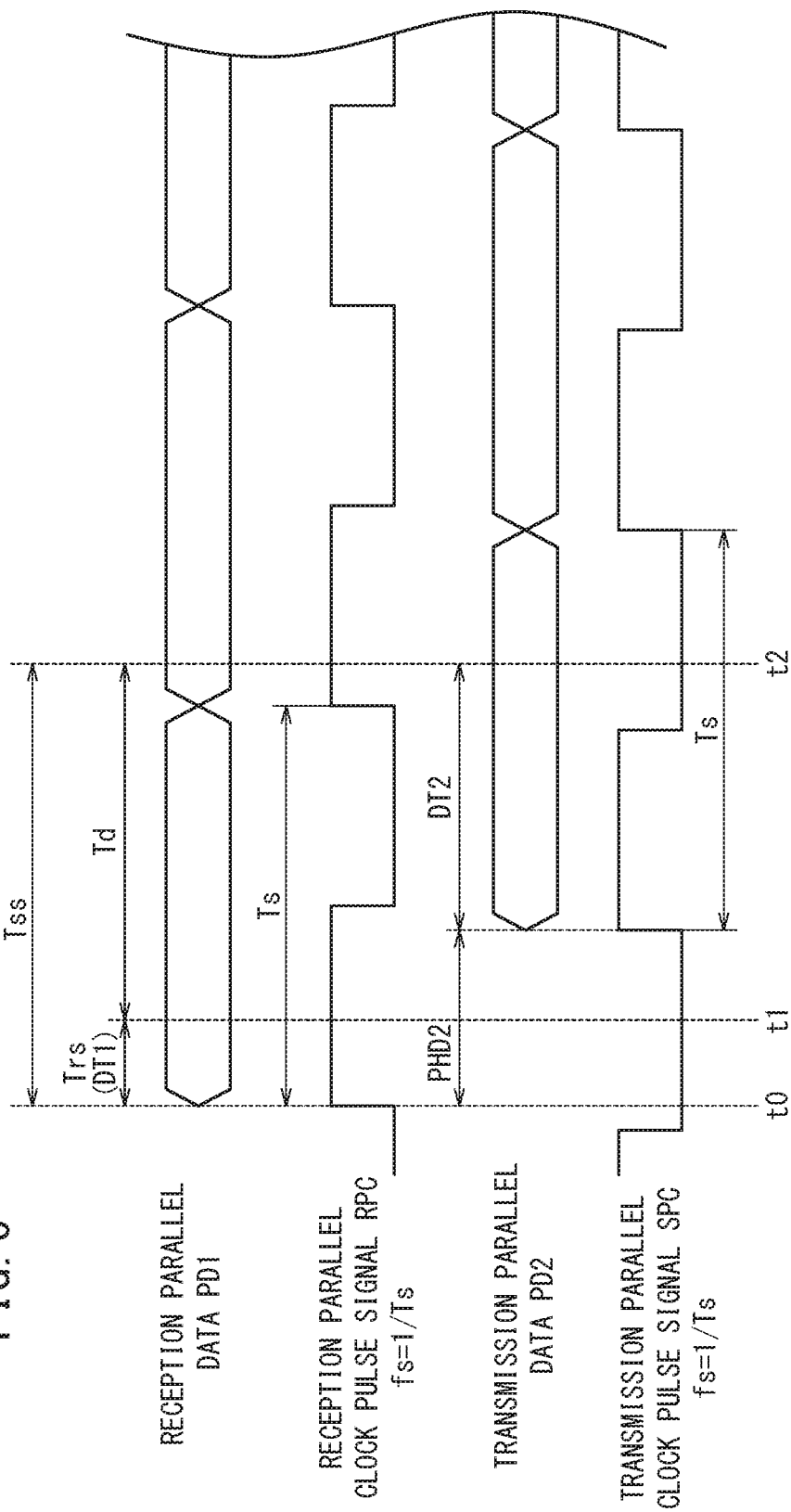
FIG. 6 is a time chart showing operations of the serial communications unit according to a first modification.

FIG. 6 is a time chart showing operations of the serial communications unit 10 according to Modification 1. The reception delay time calculating unit 22 calculates the reception delay time Trs of the reception start timing t1 at which reception of packets included within the reception parallel data PD1 is started, on the basis of the reception parallel clock pulse signal RPC. In this instance, since the phase difference between the reference parallel clock pulse signal REPC and the reception parallel clock pulse signal RPC is zero, the reception start delay amount DT1, which is detected by the reception start delay amount detection unit 22*b*, is used directly as the reception delay time Trs of the reception start timing t1 on the basis of the reception parallel clock pulse signal RPC. In other words, the relationship Trs=DT1 is satisfied.

The timing control output unit 26 controls (adjusts) the transmission delay time Tss of the transmission start timing t2 of packets on the basis of the reception parallel clock pulse signal RPC, in a manner so that the delay time Td from the reception start timing t1 of packets and until transmission of packets is started is made constant.

To explain in greater detail, the transmission delay time calculating unit 26*a* of the timing control output unit 26 adds the reception delay time Trs, which is the reception start delay amount DT1, and the delay time Td, thereby calculating the transmission delay time Tss of the transmission start timing t2 of packets on the basis of the reception parallel clock pulse signal RPC. In other words, the relationship Tss=DT1(Trs)+Td is satisfied.

The phase difference detection unit 26*b* of the timing control output unit 26 detects the phase difference PHD2 between the transmission parallel clock pulse signal SPC and the reception parallel clock pulse signal RPC. In addition, the transmission start delay amount detection unit 26*c* of the timing control output unit 26 subtracts the phase difference PHD2 from the transmission delay time Tss of the transmission start timing t2 of packets on the basis of the reception parallel clock pulse signal RPC, thereby detecting, on the basis of the transmission parallel clock pulse signal SPC, the transmission start delay amount DT2 (DT2=Tss−PHD2) of packets.

The timing control output unit 26 controls the transmission start timing t2 of packets based on the transmission start delay amount DT2. Consequently, the transmission delay time Tss of the transmission start timing t2 of packets is controlled on the basis of the reception parallel clock pulse signal RPC.

Further, according to Modification 1, the reception parallel clock pulse signal RPC is used directly and without modification as the reference parallel clock pulse signal REPC, however, a reference parallel clock pulse signal REPC which is generated by the clock pulse signal generator 30 may also be used. In this case, it is necessary for the clock pulse signal generator 30 to generate a reference parallel clock pulse signal REPC having the same period and phase as the reception parallel clock pulse signal RPC.

Modification 2

In the above-described embodiment, a clock pulse signal having the same period and being out of phase with the reception parallel clock pulse signal RPC and the transmission parallel clock pulse signal SPC was used as the reference parallel clock pulse signal REPC. However, according to Modification 2, the transmission parallel clock pulse signal SPC is used as the reference parallel clock pulse signal REPC.

Since the serial communications unit 10 of Modification 2 has a configuration substantially the same as that shown in FIG. 2, only features thereof that differ from the aforementioned embodiment will be described. According to Modification 2, since the transmission parallel clock pulse signal SPC itself serves as the reference parallel clock pulse signal REPC, the clock pulse signal generator 30 that generates the reference parallel clock pulse signal REPC is not required. Therefore, the phase difference detection unit 26*b*, which detects the phase difference PHD2 between the reference parallel clock pulse signal REPC and the transmission parallel clock pulse signal SPC, as well as the transmission start delay amount detection unit 26*c*, which calculates the transmission start delay amount DT2 using the phase difference PHD2, also are rendered unnecessary. In addition, the transmission parallel clock pulse signal SPC is input to the reception delay time calculating unit 22 as the reference parallel clock pulse signal REPC.

Figure 7:
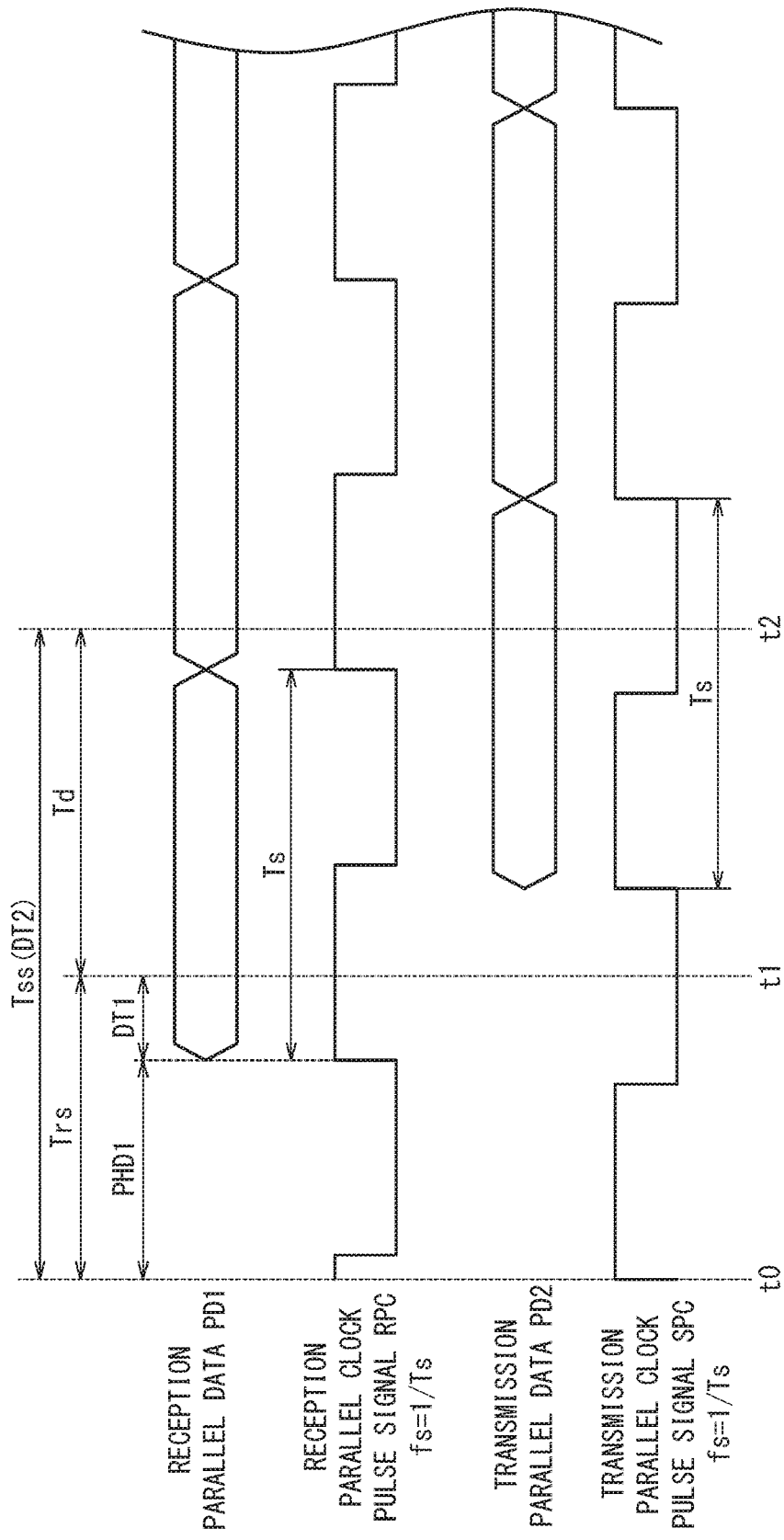
FIG. 7 is a time chart showing operations of the serial communications unit according to a second modification.

FIG. 7 is a time chart showing operations of the serial communications unit 10 according to Modification 2. The reception delay time calculating unit 22 calculates the reception delay time Trs of the reception start timing t1 at which reception of packets included within the reception parallel data PD1 is started, on the basis of the transmission parallel clock pulse signal SPC.

To explain in greater detail, the phase difference detection unit 22*a* detects the phase difference PHD1 between the reception parallel clock pulse signal RPC and the transmission parallel clock pulse signal SPC. In addition, the reception start delay amount detection unit 22*b* analyzes the reception parallel data PD1, and detects a reception start delay amount DT1 of packets included within the reception parallel data PD1. By adding the phase difference PHD1 and the reception start delay amount DT1, the reception delay time calculating unit 22 calculates the reception delay time Trs (Trs=PHD1+DT1) of the reception start timing t1 of packets included within the reception parallel data PD1, on the basis of the transmission parallel clock pulse signal SPC.

The timing control output unit 26 controls (adjusts) the transmission delay time Tss of the transmission start timing t2 of packets on the basis of the transmission parallel clock pulse signal SPC, in a manner so that the delay time Td from the reception start timing t1 of packets and until transmission of packets is started is made constant.

To explain in greater detail, the transmission delay time calculating unit 26*a* of the timing control output unit 26 adds the reception delay time Trs and the delay time Td, thereby calculating the transmission delay time Tss of the transmission start timing t2 of packets on the basis of the transmission parallel clock pulse signal SPC. In this instance, since the phase difference between the reference parallel clock pulse signal REPC and the transmission parallel clock pulse signal SPC is zero, the transmission delay time Tss, which is calculated by the transmission delay time calculating unit 26*a*, is used directly as the transmission start delay amount DT2 on the basis of the transmission parallel clock pulse signal SPC. In other words, the relationship DT2=Tss is satisfied. Accordingly, the timing control output unit 26 controls the transmission start timing t2 of packets based on the transmission start delay amount DT2, which equals the transmission delay time Tss. Consequently, the transmission delay time Tss of the transmission start timing t2 of packets is controlled on the basis of the transmission parallel clock pulse signal SPC.

Further, according to Modification 2, the transmission parallel clock pulse signal SPC is used directly and without modification as the reference parallel clock pulse signal REPC, however, a reference parallel clock pulse signal REPC which is generated by the clock pulse signal generator 30 may also be used. In this case, it is necessary for the clock pulse signal generator 30 to generate a reference parallel clock pulse signal REPC having the same period and phase as the transmission parallel clock pulse signal SPC.

As has been described above, the serial communications unit (10), as described in the aforementioned embodiment, Modification 1, and Modification 2, is connected in a daisy chain fashion. The serial communications unit (10) comprises a first conversion unit (20), a memory unit (24), a reception delay time calculating unit (22), a timing control output unit (26), and a second conversion unit (28). The first conversion unit (20) converts the reception serial data (SD1) into reception parallel data (PD1) which is synchronized with the reception parallel clock pulse signal (RPC). The memory unit (24) stores the reception parallel data (PD1) that was converted by the first conversion unit (20). The reception delay time calculating unit (22) calculates the reception delay time (Trs) of the reception start timing (t1) of packets, on the basis of the reference parallel clock pulse signal (REPC) having the same period as the reception parallel clock pulse signal (RPC). The timing control output unit (26) reads out the reception parallel data (PD1) stored in the memory unit (24) in synchronism with a transmission parallel clock pulse signal (SPC) having the same period as the reception parallel clock pulse signal (RPC), together with outputting, in synchronism with the transmission parallel clock pulse signal (SPC), the transmission parallel data (PD2), in which the transmission delay time (Tss) of the transmission start timing (t2) of packets, on the basis of the reference parallel clock pulse signal (REPC), is controlled so that a delay time (Td) from the reception start timing (t1) of packets and until transmission of packets is started is made constant. The second conversion unit (28) converts the transmission parallel data (PD2), which was output by controlling the transmission start timing (t2) of packets, into the transmission serial data (SD2).

In accordance with this feature, since the transmission delay time (Tss) of the transmission start timing (t2) of packets is controlled, even in the case that the serial data (SD) is converted into parallel data (PD), with a simple circuit configuration, it is possible to suppress a variation in the delay time in the serial communications units (10).

The reference parallel clock pulse signal (REPC) may be out of phase with the reception parallel clock pulse signal (RPC) and the transmission parallel clock pulse signal (SPC). In this case, the reception delay time calculating unit (22) may include a first phase difference detection unit (22a), which detects the first phase difference (PHD1) between the reception parallel clock pulse signal (RPC) and the reference parallel clock pulse signal (REPC), and the reception start delay amount detection unit (22b), which analyzes the reception parallel data (PD1), and detects the reception start delay amount (DT1) of packets included within the reception parallel data (PD1). By adding the first phase difference (PHD1) and the reception start delay amount (DT1), the reception delay time calculating unit (22) may calculate the reception delay time (Trs) of the reception start timing (t1) of packets, on the basis of the reference parallel clock pulse signal (REPC). The timing control output unit (26) may include a second phase difference detection unit (26b), which detects the second phase difference (PHD2) between the transmission parallel clock pulse signal (SPC) and the reference parallel clock pulse signal (REPC), and the transmission start delay amount detection unit (26c), which detects the transmission start delay amount (DT2) of packets on the basis of the transmission parallel clock pulse signal (SPC), by subtracting the second phase difference (PHD2) from the transmission delay time (Tss) of the transmission start timing (t2) of packets on the basis of the reference parallel clock pulse signal (REPC). The timing control output unit (26) may control the transmission start timing (t2) of packets based on the transmission start delay amount (DT2).

In accordance with this feature, since the transmission start timing (t2) of packets can be controlled by the period (Tc) of the communications rate, any variation in the delay times in the serial communications units (10) due to asynchronous clock switching (transferring) depends on the frequency (fc) of the communications rate, and does not depend on the frequency (fs) of the reception parallel clock pulse signal (RPC) and the transmission parallel clock pulse signal (SPC). Accordingly, even in the case that the serial data (SD) is converted into parallel data (PD), with a simple circuit configuration, it is possible to suppress a variation in the delay time in the serial communications units (10).

The reference parallel clock pulse signal (REPC) may be the reception parallel clock pulse signal (RPC), or may be a clock pulse signal having the same phase as the reception parallel clock pulse signal (RPC). In this case, the reception delay time calculating unit (22) may analyze the reception parallel data (PD1), and by detecting the reception start delay amount (DT1) of packets included within the reception parallel data (PD1), may calculate the reception delay time (Trs=DT1) of the reception start timing (t1) of packets on the basis of the reference parallel clock pulse signal (REPC). The timing control output unit (26) may include the phase difference detection unit (26b), which detects the phase difference (PHD2) between the transmission parallel clock pulse signal (SPC) and the reference parallel clock pulse signal (REPC), and the transmission start delay amount detection unit (26c), which detects the transmission start delay amount (DT2) of packets on the basis of the transmission parallel clock pulse signal (SPC), by subtracting the phase difference (PHD2) from the transmission delay time (Tss) of the transmission start timing (t2) of packets on the basis of the reference parallel clock pulse signal (REPC). The timing control output unit (26) may control the transmission start timing (t2) of packets based on the transmission start delay amount (DT2).

In accordance with this feature, since the transmission start timing (t2) of packets can be controlled by the period (Tc) of the communications rate, any variation in the delay times in the serial communications units (10) due to asynchronous clock switching (transferring) depends on the frequency (fc) of the communications rate, and does not depend on the frequency (fs) of the reception parallel clock pulse signal (RPC) and the transmission parallel clock pulse signal (SPC). Accordingly, even in the case that the serial data (SD) is converted into parallel data (PD), with a simple circuit configuration, it is possible to suppress a variation in the delay time in the serial communications units (10).

The reference parallel clock pulse signal (REPC) may be the transmission parallel clock pulse signal (SPC), or may be a clock pulse signal having the same phase as the transmission parallel clock pulse signal (SPC). In this case, the reception delay time calculating unit (22) may include a phase difference detection unit (22*a*), which detects the phase difference (PHD1) between the reception parallel clock pulse signal (RPC) and the reference parallel clock pulse signal (REPC), and the reception start delay amount detection unit (22*b*), which analyzes the reception parallel data (PD1), and detects the reception start delay amount (DT1) of packets included within the reception parallel data (PD1). By adding the phase difference (PHD1) and the reception start delay amount (DT1), the reception delay time calculating unit (22) may calculate the reception delay time (Trs) of the reception start timing (t1) of packets, on the basis of the reference parallel clock pulse signal (REPC).

In accordance with this feature, since the transmission start timing (t2) of packets can be controlled by the period (Tc) of the communications rate, any variation in the delay times in the serial communications units (10) due to asynchronous clock switching (transferring) depends on the frequency (fc) of the communications rate, and does not depend on the frequency (fs) of the reception parallel clock pulse signal (RPC) and the transmission parallel clock pulse signal (SPC). Accordingly, even in the case that the serial data (SD) is converted into parallel data (PD), with a simple circuit configuration, it is possible to suppress a variation in the delay time in the serial communications units (10).

While the invention has been particularly shown and described with reference to preferred embodiments, it will be understood that variations and modifications can be effected thereto by those skilled in the art without departing from the scope of the invention as defined by the appended claims.

What is claimed is:

1. A serial communications unit connected in a daisy chain fashion, comprising:
   a first conversion unit configured to convert reception serial data into reception parallel data which is synchronized with a reception parallel clock pulse signal;
   a memory unit configured to store the reception parallel data converted by the first conversion unit;
   a reception delay time calculating unit configured to calculate a reception delay time of a reception start timing at which reception of packets is started, on a basis of a reference parallel clock pulse signal having a same period as the reception parallel clock pulse signal;
   a timing control output unit configured to read out the reception parallel data stored in the memory unit in synchronism with a transmission parallel clock pulse signal having the same period as the reception parallel clock pulse signal, and to output transmission parallel data, in which a transmission delay time of a transmission start timing at which transmission of packets is started, on the basis of the reference parallel clock pulse signal, is controlled so that a delay time from the reception start timing and until transmission of packets is started is made constant, in synchronism with the transmission parallel clock pulse signal; and
   a second conversion unit configured to convert the transmission parallel data, which is output by controlling the transmission start timing, into transmission serial data.

2. The serial communications unit according to claim 1, wherein:
   the reference parallel clock pulse signal is out of phase with the reception parallel clock pulse signal and the transmission parallel clock pulse signal;
   the reception delay time calculating unit includes a first phase difference detection unit configured to detect a first phase difference between the reception parallel clock pulse signal and the reference parallel clock pulse signal, and a reception start delay amount detection unit configured to analyze the reception parallel data, and to detect a reception start delay amount of packets included within the reception parallel data, wherein by adding the first phase difference and the reception start delay amount, the reception delay time of the reception start timing on the basis of the reference parallel clock pulse signal is calculated; and
   the timing control output unit includes a second phase difference detection unit configured to detect a second phase difference between the transmission parallel clock pulse signal and the reference parallel clock pulse signal, and a transmission start delay amount detection unit configured to detect a transmission start delay amount of packets on a basis of the transmission parallel clock pulse signal, by subtracting the second phase difference from the transmission delay time of the transmission start timing on the basis of the reference parallel clock pulse signal, wherein the transmission start timing is controlled based on the transmission start delay amount.

3. The serial communications unit according to claim 1, wherein:
   the reference parallel clock pulse signal is the reception parallel clock pulse signal, or is a clock pulse signal having a same phase as the reception parallel clock pulse signal;
   the reception delay time calculating unit analyzes the reception parallel data, and by detecting a reception start delay amount of packets included within the reception parallel data, calculates the reception delay time of the reception start timing on the basis of the reference parallel clock pulse signal; and
   the timing control output unit includes a phase difference detection unit configured to detect a phase difference between the transmission parallel clock pulse signal and the reference parallel clock pulse signal, and a transmission start delay amount detection unit configured to detect a transmission start delay amount of packets on a basis of the transmission parallel clock pulse signal, by subtracting the phase difference from the transmission delay time of the transmission start timing on the basis of the reference parallel clock pulse signal, wherein the transmission start timing is controlled based on the transmission start delay amount.

4. The serial communications unit according to claim 1, wherein:
   the reference parallel clock pulse signal is the transmission parallel clock pulse signal, or is a clock pulse signal having a same phase as the transmission parallel clock pulse signal; and
   the reception delay time calculating unit includes a phase difference detection unit configured to detect a phase difference between the reception parallel clock pulse signal and the reference parallel clock pulse signal, and a reception start delay amount detection unit configured to analyze the reception parallel data, and to detect a reception start delay amount of packets included within the reception parallel data, wherein, by adding the phase difference and the reception start delay amount, the reception delay time of the reception start timing on the basis of the reference parallel clock pulse signal is calculated.

5. A communication method for a serial communications unit connected in a daisy chain fashion, comprising:

a first conversion step of converting reception serial data into reception parallel data which is synchronized with a reception parallel clock pulse signal, and storing the reception parallel data in a memory unit;

a reception delay time calculating step of calculating a reception delay time of a reception start timing at which reception of packets is started, on a basis of a reference parallel clock pulse signal having a same period as the reception parallel clock pulse signal;

a timing control output step of reading out the reception parallel data stored in the memory unit in synchronism with a transmission parallel clock pulse signal having the same period as the reception parallel clock pulse signal, and outputting transmission parallel data, in which a transmission delay time of a transmission start timing at which transmission of packets is started, on the basis of the reference parallel clock pulse signal, is controlled so that a delay time from the reception start timing and until transmission of packets is started is made constant, in synchronism with the transmission parallel clock pulse signal; and a second conversion step of converting the transmission parallel data, which is output by controlling the transmission start timing, into transmission serial data.

6. The communication method for the serial communications unit according to claim 5, wherein:

the reference parallel clock pulse signal is out of phase with the reception parallel clock pulse signal and the transmission parallel clock pulse signal;

the reception delay time calculating step includes a first phase difference detection step of detecting a first phase difference between the reception parallel clock pulse signal and the reference parallel clock pulse signal, and a reception start delay amount detection step of analyzing the reception parallel data, and detecting a reception start delay amount of packets included within the reception parallel data, wherein by adding the first phase difference and the reception start delay amount, the reception delay time of the reception start timing on the basis of the reference parallel clock pulse signal is calculated; and the timing control output step includes a second phase difference detection step of detecting a second phase difference between the transmission parallel clock pulse signal and the reference parallel clock pulse signal, and a transmission start delay amount detection step of detecting a transmission start delay amount of packets on a basis of the transmission parallel clock pulse signal, by subtracting the second phase difference from the transmission delay time of the transmission start timing on the basis of the reference parallel clock pulse signal, wherein the transmission start timing is controlled based on the transmission start delay amount.

7. The communication method for the serial communications unit according to claim 5, wherein:

the reference parallel clock pulse signal is the reception parallel clock pulse signal, or is a clock pulse signal having a same phase as the reception parallel clock pulse signal;

in the reception delay time calculating step, the reception parallel data is analyzed, and by detecting a reception start delay amount of packets included within the reception parallel data, the reception delay time of the reception start timing on the basis of the reference parallel clock pulse signal is calculated; and the timing control output step includes a phase difference detection step of detecting a phase difference between the transmission parallel clock pulse signal and the reference parallel clock pulse signal, and a transmission start delay amount detecting step of detecting a transmission start delay amount of packets on a basis of the transmission parallel clock pulse signal, by subtracting the phase difference from the transmission delay time of the transmission start timing on the basis of the reference parallel clock pulse signal, wherein the transmission start timing is controlled based on the transmission start delay amount.

8. The communication method for the serial communications unit according to claim 5, wherein:

the reference parallel clock pulse signal is the transmission parallel clock pulse signal, or is a clock pulse signal having a same phase as the transmission parallel clock pulse signal; and the reception delay time calculating step includes a phase difference detection step of detecting a phase difference between the reception parallel clock pulse signal and the reference parallel clock pulse signal, and a reception start delay amount detection step of analyzing the reception parallel data, and detecting a reception start delay amount of packets included within the reception parallel data, wherein by adding the phase difference and the reception start delay amount, the reception delay time of the reception start timing on the basis of the reference parallel clock pulse signal is calculated.

* * * * *